US009063378B2

(12) United States Patent
Jung et al.

(10) Patent No.: US 9,063,378 B2
(45) Date of Patent: Jun. 23, 2015

(54) PHOTO ALIGNMENT METHOD, EXPOSURE SYSTEM FOR PERFORMING THE SAME AND LIQUID CRYSTAL DISPLAY PANEL MANUFACTURED BY THE SAME

(71) Applicant: SAMSUNG DISPLAY CO., LTD., Gyeonggi-do (KR)

(72) Inventors: Jin-Soo Jung, Gyeonggi-do (KR); Young-Gu Kim, Gyeonggi-do (KR); Jun-Woo Lee, Gyeonggi-do (KR); Baek-Kyun Jeon, Gyeonggi-do (KR); Min-Sik Jung, Seoul (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 280 days.

(21) Appl. No.: 13/724,482

(22) Filed: Dec. 21, 2012

(65) Prior Publication Data

US 2013/0176521 A1 Jul. 11, 2013

(30) Foreign Application Priority Data

Jan. 6, 2012 (KR) ........................ 10-2012-0002042

(51) Int. Cl.
*G03B 27/52* (2006.01)
*G03B 27/32* (2006.01)
*G02F 1/1337* (2006.01)
*G03F 7/20* (2006.01)

(52) U.S. Cl.
CPC ........ *G02F 1/133753* (2013.01); *G02F 1/1337* (2013.01); *G03F 7/70141* (2013.01); *G02F 1/133788* (2013.01); *G02F 2001/133757* (2013.01)

(58) Field of Classification Search
CPC .......... G03F 7/70141; G02F 1/133753; G02F 1/133788
USPC .................... 355/52, 53, 55, 77; 356/399–401
See application file for complete search history.

(56) References Cited

U.S. PATENT DOCUMENTS

| 5,325,176 | A | * | 6/1994 | Suda et al. ..................... 356/509 |
| 5,340,992 | A | * | 8/1994 | Matsugu et al. .............. 250/548 |
| 6,157,452 | A | * | 12/2000 | Hasegawa et al. ............ 356/401 |
| 2007/0184596 | A1 | | 8/2007 | Ando | |

FOREIGN PATENT DOCUMENTS

| JP | 2007-114647 | 5/2007 |
| JP | 2008-147214 | 6/2008 |

* cited by examiner

*Primary Examiner* — Hung Henry Nguyen
(74) *Attorney, Agent, or Firm* — F. Chau & Associates, LLC

(57) ABSTRACT

In a photo alignment method, a substrate and a mask are aligned so that the substrate is spaced apart from the mask by a predetermined gap. An organic layer is formed on the substrate. The mask has a transmission portion and a light blocking portion. Light is irradiated through the mask in a direction substantially parallel with an interface between the transmission portion and the light blocking portion of the mask. Polymer chains are formed on an upper portion of the organic layer. The polymer chains are aligned in an alignment direction toward an incident direction of the light. Locations of the substrate and the mask are sensed in real time. The mask is transported to a predetermined location with respect to the substrate based on the sensed locations of the substrate and the mask.

11 Claims, 18 Drawing Sheets

PHOTO ALIGNMENT METHOD, EXPOSURE SYSTEM FOR PERFORMING THE SAME AND LIQUID CRYSTAL DISPLAY PANEL MANUFACTURED BY THE SAME

CROSS-REFERENCE TO RELATED APPLICATION

This application claims priority under 35 U.S.C. §119 to Korean Patent Application No. 10-2012-0002042, filed on Jan. 6, 2012 in the Korean Intellectual Property Office (KIPO), the contents of which are incorporated by reference herein in its entirety.

TECHNICAL FIELD

Exemplary embodiments of the present invention relate to a photo alignment method, an exposure system for performing the photo alignment method and a liquid crystal display panel manufactured by the photo alignment method. More particularly, exemplary embodiments of the present invention relate to a photo alignment method that can improve image display quality, an exposure system for performing the photo alignment method and a liquid crystal display panel manufactured by the photo alignment method.

DISCUSSION OF THE RELATED ART

A liquid crystal display (LCD) is a flat panel display. The liquid crystal molecules in the LCD panel are aligned in a direction perpendicular to the panel. Contrast ratio and viewing angle of the display panel change depending on the alignment of the liquid crystal molecules.

The electrodes of the panel may have slits or protrusions which change the tilting direction of liquid crystal molecules when an electric field is applied to the liquid crystal molecules. The slits and protrusions are arranged to increase the viewing angle.

However, the slits and protrusions may cause a decrease in the luminance of the display panel.

SUMMARY

Exemplary embodiments of the present invention provide a photo alignment method that can improve an image display quality, an exposure system for performing the photo alignment method, and a liquid crystal display panel manufactured by the photo alignment method.

According to an exemplary embodiment of the present invention, a photo alignment method is provided as follows. A substrate and a mask are aligned so that the substrate is spaced apart from the mask by a predetermined gap. An organic layer is formed on the substrate. The mask has a transmission portion and a light blocking portion. Light is irradiated through the mask in a direction substantially parallel with an interface between the transmission portion and the light blocking portion of the mask. Polymer chains are formed on an upper portion of the organic layer. The polymer chains are aligned in an alignment direction toward an incident direction of the light. Locations of the substrate and the mask are sensed in real time. The mask is transported to a predetermined location with respect to the substrate based on the sensed locations of the substrate and the mask.

In an exemplary embodiment, the substrate and the mask are aligned by determining an offset value between the substrate and the mask based on the gap between the substrate and the mask, and transporting the mask in response to the offset value.

In an exemplary embodiment, a direction of transporting the mask is substantially parallel with the interface between the transportation portion and the light blocking portions of the mask.

In an exemplary embodiment, the location is sensed in the real time process by sensing a height between an upper surface of the substrate and a lower surface of the mask, and taking an image of a reference line on the mask and an alignment line on the substrate in a direction substantially perpendicular to a transportation direction of the substrate.

In an exemplary embodiment, the mask is transported to the predetermined location with respect to the substrate by transporting the mask based on the sensed height so that the gap between the mask and the substrate is substantially the same as the predetermined gap, and transporting the mask so that the reference line in the taken image is spaced apart from the alignment line by a predetermined reference value.

In an exemplary embodiment, the location is sensed in the real time process by taking an image of a reference line on the mask and an alignment line on the substrate in a direction substantially parallel with a direction of irradiating the light.

In an exemplary embodiment, the mask is transported to the predetermined location with respect to the substrate by transporting the mask so that the reference line in the taken image is on a same line as the alignment line.

In an exemplary embodiment, the mask further includes an alignment pattern having a reference line for aligning the mask with respect to the substrate, the transmission portion spaced apart from the alignment pattern in a direction of transporting the substrate, and an exposure pattern including the light blocking portion. The mask is transported at a period corresponding to a distance between the alignment pattern and the exposure pattern.

In an exemplary embodiment, the substrate further includes a pixel region having a plurality of sub regions arranged in a matrix pattern. The polymer chains are formed in the alignment direction by irradiating the light to sub regions of a first column through a first mask in a direction substantially parallel with a row direction toward the first column to form first polymer chains inclined in a first alignment direction, and irradiating the light to sub regions of a second column through a second mask in a direction substantially parallel with the row direction toward the second column to form second polymer chains inclined in a second alignment direction.

In an exemplary embodiment, the polymer chains are aligned in the alignment direction by irradiating the light in a first sub region and a second sub region in a direction substantially parallel with a column direction toward the first column so that the first polymer chains and the second polymer chains are rotated toward a center of the matrix pattern, and irradiating the light in a third sub region and a fourth sub region in a direction substantially parallel with the column direction toward the second column so that the first polymer chains and the second polymer chains are rotated toward a center of the matrix pattern. The first polymer chains of a first row are formed in the first sub region. The second polymer chains of the first row are formed in the second sub region. The first polymer chains of a second row are formed in the third sub region. The second polymer chains of the second row are formed in the fourth sub region.

In an exemplary embodiment, the substrate further includes a pixel region having a plurality of sub regions arranged in a matrix pattern. The polymer chains are formed in the alignment direction by forming first polymer chains arranged in a first alignment direction substantially parallel with a column direction in the sub regions in a first row toward the first column using a first mask, and forming second polymer chains arranged in a second alignment direction substantially parallel with the column direction in the sub regions in a second row toward the second column using a second mask.

According to an exemplary embodiment of the present invention, an exposure system includes a substrate, a mask, a light source part, a displacement and a system. The substrate transporting part transports a substrate in a first direction. The mask includes an alignment pattern, transmission portion and a light blocking portion. The alignment pattern has a reference line. An interface between the transmission portion and the light blocking portion is extended in the first direction. The light source part irradiates light to the mask in a second direction substantially perpendicular to the first direction. The displacement sensing part senses location of the substrate and the mask in real time. The system controlling part transports the mask based on the sensed location of the substrate and the mask.

In an exemplary embodiment, the system controlling part determines an offset value between the mask and the substrate based on a gap between the substrate and the mask, to transport the mask using the offset value.

In an exemplary embodiment, the displacement sensing part includes a laser displacement sensor sensing a height between an upper surface of the substrate and a lower surface of the mask using a laser beam, and a camera taking an image of a signal line of the substrate and the reference line of the mask in a third direction substantially perpendicular to the first and second direction. The system controlling part transports the mask based on the sensed height so that a gap between the mask and the substrate is substantially the same as the reference gap, and transports the mask so that the reference line in the taken image signal is spaced apart from the alignment line by a predetermined distance.

In an exemplary embodiment, the displacement sensing part further includes an oblique camera picking up an image of a reference line of the mask and an alignment line of the substrate in a direction substantially parallel with the direction of irradiating the light. The system controlling part transports the mask so that the reference line in the picked up image data is substantially the same as the alignment line.

According to an exemplary embodiment of the present invention, a liquid crystal display panel includes a pixel electrode and an alignment layer. The pixel electrode is disposed in a pixel region. The pixel region has a plurality of sub regions arranged in a matrix pattern. The alignment layer aligns alignment directors of liquid crystal molecules in each of the sub regions toward a center of the matrix pattern in an initial state.

In an exemplary embodiment, the liquid crystal display panel further includes a first display panel and a second display panel. The first display panel includes a first base substrate, a gate line extended in a first direction on the first base substrate, a data line extended in a second direction crossing the first direction, a switching element electrically connected to the gate and data lines, a pixel electrode electrically connected to the switching element and a first alignment layer disposed on the pixel electrode. The second display substrate includes a second base substrate facing the first base substrate and a second alignment layer disposed on the second base substrate.

In an exemplary embodiment, sub regions of a first column of the first alignment layer are aligned in a first alignment direction toward a second column adjacent to the first column.

The first alignment direction is substantially parallel with the first direction. Sub regions of the second column are aligned in a second alignment direction toward the first column. The second alignment direction is substantially parallel with the first direction. Sub regions of a first row of the second alignment layer are aligned in a third alignment direction toward a second row adjacent to the first row. The third alignment direction is substantially parallel with the second direction. Sub regions of the second row of the second alignment layer are aligned in a fourth alignment direction toward the first row. The fourth alignment direction is substantially parallel with the second direction.

In an exemplary embodiment, sub regions of a first column of the first alignment layer are aligned in a first alignment direction toward a second column adjacent to the first column. The first alignment direction is substantially parallel with the second direction. Sub regions of the second column are aligned in a second alignment direction toward the first column. The second alignment direction is substantially parallel with the second direction. Sub regions of a first row of the second alignment layer are aligned in a third alignment direction toward a second row adjacent to the first row. The third alignment direction is substantially parallel with the first direction. Sub regions of the second row of the second alignment layer are aligned in a fourth alignment direction toward the first row. The fourth alignment direction is substantially parallel with the first direction.

In an exemplary embodiment, the sub regions of one of the first and second alignment layers have a plurality of alignment directions that are substantially parallel with a direction of a sum of vectors corresponding to the first and second directions and are aligned toward a center of the matrix pattern, and the sub regions of the other of the first and second alignment layers are vertically aligned.

According to a photo alignment method, an exposure system for performing the photo alignment method and a liquid crystal display panel manufactured by the photo alignment method, aligning director of a liquid crystal in sub regions arranged in a matrix pattern is inclined toward a center of the matrix so that the liquid crystals are concentrated in an initial stage. The liquid crystals form a concentration structure. Thus, response speed and light transmittance of the liquid crystals are improved, and afterimage is decreased. Therefore, image display quality of a liquid crystal display apparatus can be improved.

BRIEF DESCRIPTION OF THE DRAWINGS

The embodiments of the present invention will become more apparent by the detailed description with reference to the accompanying drawings, in which.

DETAILED DESCRIPTION

Figure 1:
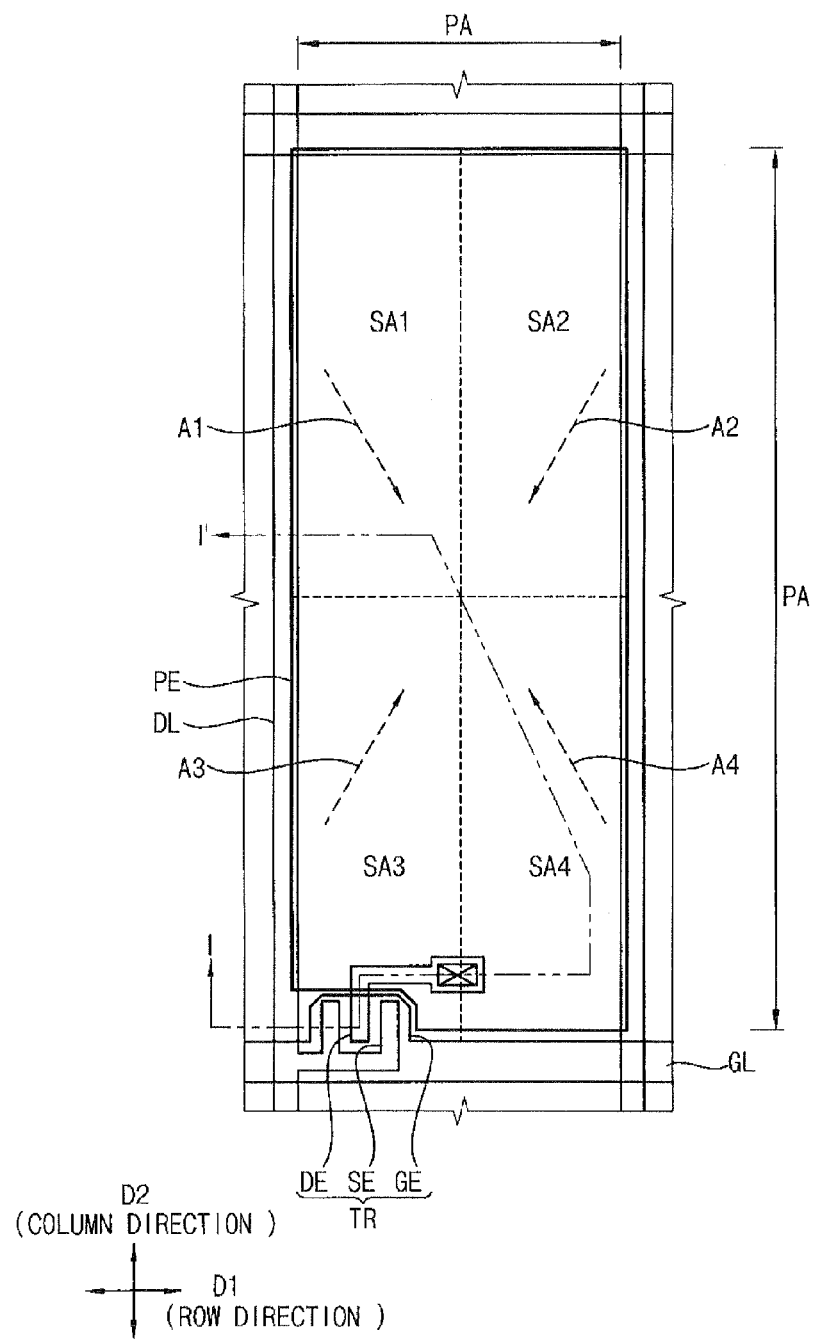
FIG. 1 is a plan view illustrating a display panel according to an exemplary embodiment of the present invention.

Hereinafter, embodiments of the present invention will be described in detail with reference to the accompanying drawings, wherein the same reference numerals may be used to denote the same or substantially the same elements throughout the specification and the drawings. The present invention may be embodied in various different ways and should not be construed as limited to the exemplary embodiments described herein.

It will be understood that when an element or layer is referred to as being "on," "connected to" or "coupled to" another element or layer, it can be directly on, connected or coupled to the other element or layer or intervening elements or layers may be present.

As used herein, the singular forms, "a," "an" and "the" are intended to include the plural forms as well, unless the context clearly indicates otherwise.

Figure 2:
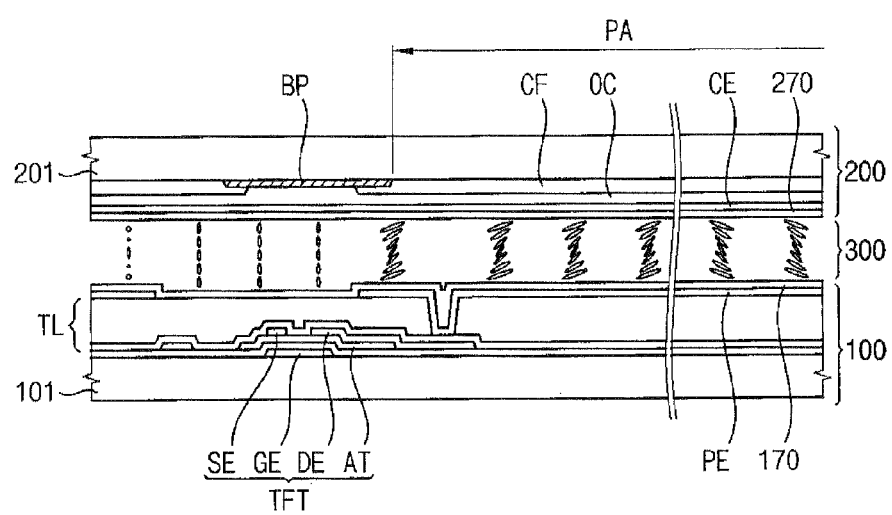
FIG. 2 is a cross-sectional view taken along a line I-I' shown in FIG. 1.
Figure 3:
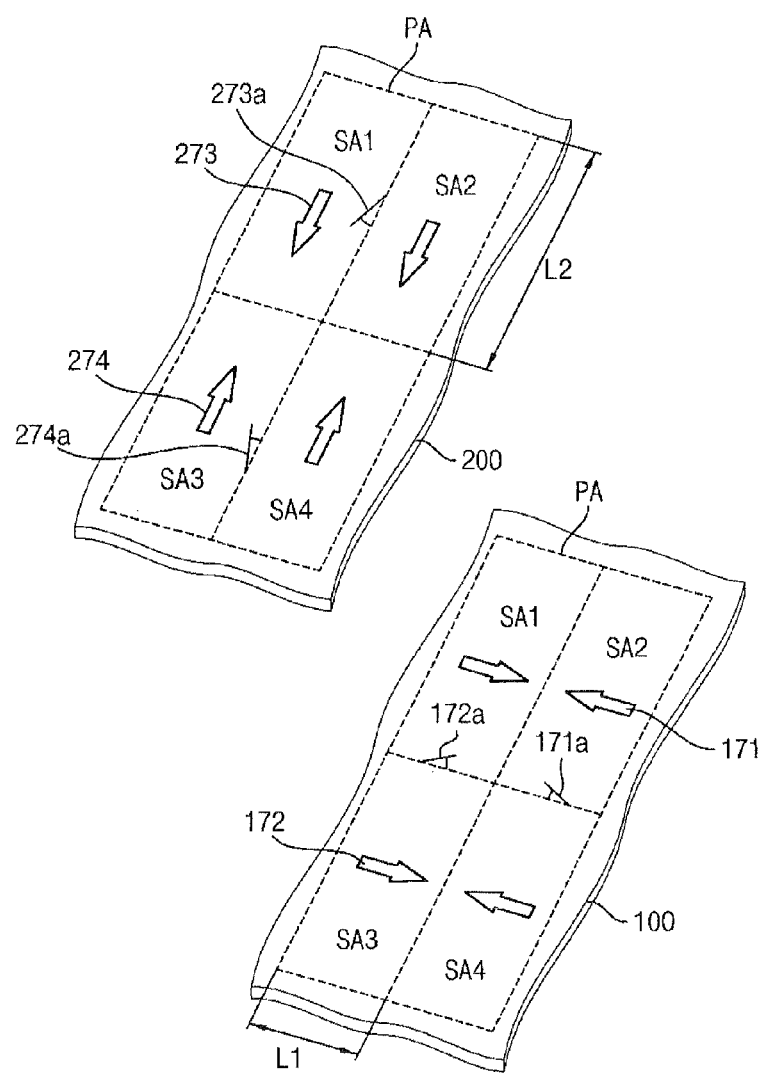
FIG. 3 is a perspective view illustrating an alignment direction of an alignment layer of the display panel shown in FIG. 1.

FIG. 1 is a plan view illustrating a display panel according to an exemplary embodiment of the present invention. FIG. 2 is a cross-sectional view taken along a line I-I' shown in FIG. 1. FIG. 3 is a perspective view illustrating an alignment direction of an alignment layer of the display panel shown in FIG. 1.

Referring to FIGS. 1 to 3, the display panel includes a first display substrate 100, a second display substrate 200 and a liquid crystal layer 300.

The first display substrate 100 includes a first base substrate 101, a plurality of gate lines GL, a plurality of data lines DL, a plurality of switching elements TR, a plurality of pixel electrodes PE and a first alignment layer 170.

The gate lines GL are extended in a first direction D1 on the first base substrate 101. The gate liens GL are arranged in a second direction D2 crossing the first direction D1. For example, the first direction D1 is a row direction of the first base substrate 101, and the second direction D2 is a column direction of the first base substrate 101. Each of the switching elements TR is disposed on the first base substrate 101 where a corresponding gate line GL crosses a corresponding data line DL. The switching element TR is electrically connected to the gate and data lines GL and DL. The gate lines GL, the data lines DL and the switching elements TR are included in an array layer AL. The first display substrate 100 includes the array layer FL.

Each of the pixel electrodes PE is electrically connected to a corresponding switching element TR. The pixel electrode PE is disposed in a pixel region PA of the first base substrate 101. The pixel region PA includes a plurality of sub regions SA1, SA2, SA3 and SA4. For example, the sub regions SA1, SA2, SA3 and SA4 are arranged in a 2×2 matrix pattern. A first row of the matrix pattern includes first and second sub regions SA1 and SA2, and a second row of the matrix pattern includes third and fourth sub regions SA3 and SA4. A first column of the matrix pattern includes the first and third sub regions SA1 and SA3, and a second column of the matrix pattern includes the second and fourth sub regions SA2 and SA4.

The first alignment layer 170 includes a plurality of polymer chains 171a and 172a on a surface of the first alignment layer 170. The polymer chains 171a and 172a have a plurality of alignment directions 171 and 172. For example, according to an embodiment, the polymer chains 171a and 172a include high polymer chains. The polymer chains 171a and 172a are formed by photopolymerization of a photosensitive high polymer layer.

For example, the photosensitive high polymer layer includes polyimide main chains and side chains that are connected to the polyimide main chains and exposed to a surface of the photosensitive high polymer layer. The side chains have double bonds which allow the side chains to have an orientation. When light (e.g. ultraviolet light) having a polarizing axis substantially parallel with a longitudinal direction of the side chains is incident into the side chains, the side chains are photopolymerized. Thus, the side chains have an alignment direction inclined with respect to a normal axis of the first base substrate 101, e.g., by an incident angle of the light.

Aligning directors of liquid crystal molecules are disposed on the surface of the first alignment layer 170. The aligning directors are inclined in a direction substantially parallel with the alignment direction of the side chains. The alignment direction is defined by an angle between the first base substrate 101 and the aligning directors of the liquid crystal molecules. Alternatively, the alignment direction is defined by an incident angle of the light (e.g. ultraviolet light).

As shown in FIG. 3, first polymer chains 171a having a first alignment direction 171 are disposed in the second and fourth sub regions SA2 and SA4 of the first alignment layer 170, and second polymer chains 172a having a second alignment direction 172 are disposed in the first and third sub regions SA1 and SA3 of the first alignment layer 170. The second alignment direction 172 is opposite to the first alignment direction 171.

The second display substrate 200 includes a second base substrate 201, a light blocking pattern BP, a color filter CF, an overcoating layer OC, an electrode layer CE and a second alignment layer 270.

The light blocking pattern BP is disposed on the second base substrate 201 corresponding to the gate lines GL, the data lines DL and the switching elements TR of the first display substrate 100. The light blocking pattern BP blocks light. Alternatively, the light blocking pattern BP is disposed on the first base substrate 101, and the first display substrate 100 includes the light blocking pattern BP.

The color filter CF is disposed on the second base substrate 201 corresponding to the pixel region PA in which the pixel electrode PE is formed. The color filter CF filters color light. Alternatively, the color filter CF is disposed on the first base substrate 101, and the first display substrate 100 includes the color filter CF.

The overcoating layer OC is disposed on the second base substrate having the color filter CF and planarizes the second display substrate 200. Alternatively, the overcoating layer OC is omitted.

The electrode layer CE is disposed on the second base substrate 201. The electrode layer CE faces the pixel electrode PE. A reference voltage for defining a polarity of a voltage applied to the pixel electrode PE is applied to the electrode layer CE. For example, the reference voltage includes a common voltage. Alternatively, the first display substrate 100 includes the electrode layer CE.

The second alignment layer 270 includes polymer chains 273a and 274a on a surface of the second alignment layer 270. The polymer chains 273a and 274a have a plurality of alignment directions 273 and 274. For example, the polymer chains 273a and 274a include high polymer chains. The polymer chains 273a and 274a are formed by photopolymerization of a photosensitive high polymer layer.

As shown in FIG. 3, third polymer chains 273a having a third alignment direction 273 are disposed in the first and second sub regions SA1 and SA2 of the second alignment layer 270, and fourth polymer chains 274a having a fourth alignment direction 274 are disposed in the third and fourth sub regions SA3 and SA4 of the second alignment layer 270. The fourth alignment direction 274 is opposite to the third alignment direction 273.

The aligning directors of the liquid crystal molecules disposed between the first and second alignment layers 170 and 270 of the display panel are aligned in first, second, third and fourth aligning directions A1, A2, A3 and A4 depending on the first to fourth alignment directions 171, 172, 273 and 274 of the first and second alignment layers 170 and 270.

For example, the aligning directors of the liquid crystal molecules in the first sub region SA1 are aligned in a first aligning direction A1 that corresponds to a sum of vectors corresponding to the second and third alignment directions 172 and 273. The aligning directors of the liquid crystals in the second sub region SA2 are aligned in a second aligning direction A2 that corresponds to a sum of vectors corresponding to the first and third alignment directions 171 and 273. The aligning directors of the liquid crystals in the third sub region SA3 are aligned in a third aligning direction A3 that corresponds to a sum of the vectors corresponding to the second and fourth alignment directions 172 and 274. The aligning directors of the liquid crystals in the fourth sub region SA4 are aligned in a fourth aligning direction A4 that corresponds to a sum of the vectors corresponding to the first and fourth alignment directions 171 and 274.

For example, the sub regions SA1, SA2, SA3 and SA4 are arranged in a 2×2 matrix pattern, and the first to fourth aligning directions A1, A2, A3 and A4 are concentrated toward a center of the 2×2 matrix pattern.

Therefore, the display panel can have an increased response speed and light transmittance together with reduced afterimages.

Figure 4:
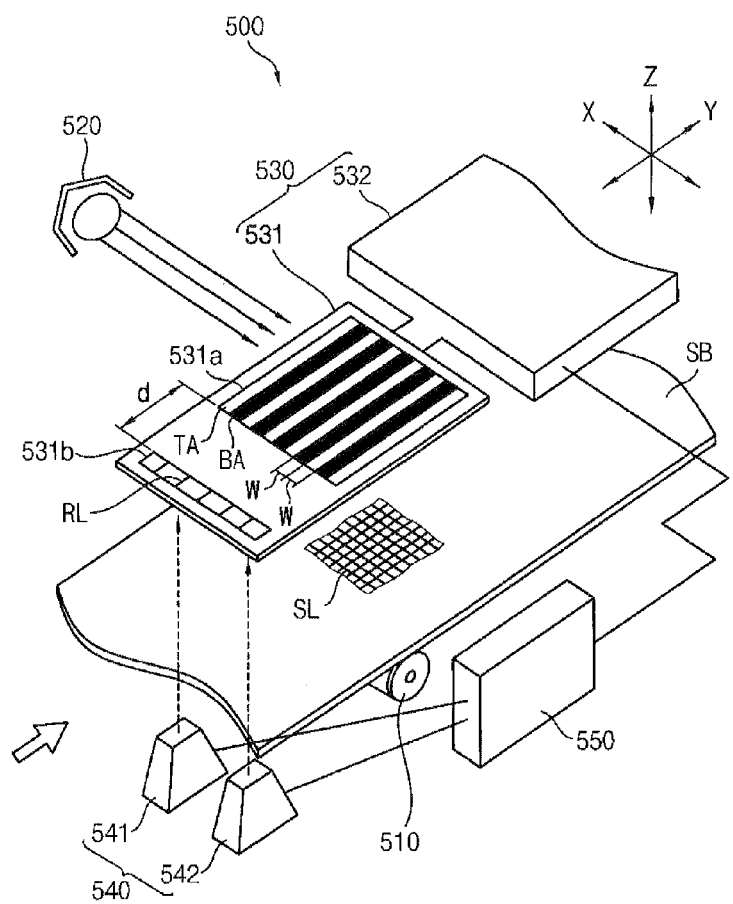
FIG. 4 is a block diagram illustrating an exposure system for manufacturing the display panel shown in FIG. 1.

FIG. 4 is a block diagram illustrating an exposure system for manufacturing the display panel shown in FIG. 1.

Referring to FIGS. 1 and 4, the exposure system 500 includes a substrate transporting part 510, a light source part 520, a mask part 530, a displacement sensing part 540 and a system controlling part 550.

The substrate transporting part 510 supports and transports a substrate SB. For example, the substrate transporting part 510 transports the substrate SB in a direction substantially parallel with a Y-axis of the substrate.

The light source part 520 includes a light source that generates light. The light source includes a lamp that generates ultraviolet light. Light is irradiated onto the substrate SB in a direction substantially parallel with an X-axis of the substrate SB. The X-axis is substantially perpendicular to the Y-axis that is the transporting direction of the substrate SB.

The mask part 530 includes a mask 531 and a mask transporting portion 532.

The mask 531 includes an exposure pattern 531a and an aligning pattern 531b. The exposure pattern 531a is spaced apart by a reference distance from the aligning pattern 531b in the transporting direction.

The exposure pattern 531a includes a transmission portion TA and a light blocking portion BA to selectively transmit and block the ultraviolet light. As shown in FIG. 3, widths of the transmission portion TA and the light blocking portion BA corresponding to the first display substrate 100 are determined based on a short distance L1 of the sub region, and widths of the transmission portion TA and the light blocking portion BA corresponding to the second display substrate 200 are determined based on a long distance L2 of the sub region. The transmission portion TA and the light blocking portion BA are alternately arranged in the X-axis direction that is substantially parallel with the incident direction of the light. The transmission portion TA and the light blocking portion BA are extended in the Y-axis direction that is substantially perpendicular to the X-axis direction.

The aligning pattern 531b includes a reference line RL. The reference line RL is used for aligning the mask 531 with respect to the substrate SB. A location of the reference line RL is compared with a location of the substrate SB to determine a location of the mask 531. The substrate SB includes the first display substrate 100, and the signal line SL includes the gate line GL or the data line SL. Alternatively, the substrate SB includes the second display substrate 200, and the signal line SL includes an additional line defined to align the mask 531.

The mask transporting portion 532 transports the mask 531 in the X-axis direction, the Y-axis direction or a Z-axis direction shown in FIG. 4.

The displacement sensing part 540 is disposed under the mask 531 and senses the location of the substrate SB and the mask 531 in real time. For example, the location of the substrate SB and the mask 531 is sensed every several micrometers with respect to the substrate SB.

The displacement sensing part 540 include a laser displacement sensor 541 and a camera 542. The laser displacement sensor 541 irradiates a laser beam in the Z-axis direction and senses heights of the substrate SB and the mask 531 with respect to the laser displacement sensor 541.

The camera 542 is aligned along the Z-axis and takes an image of a portion of the substrate SB adjacent to the aligning pattern 531b of the mask 531. The taken image includes images of the reference line RL of the aligning pattern 531b and the signal line SL of the substrate SB. An image signal of the taken image is applied to the system controlling part 550.

The system controlling part 550 compensates for the location of the mask 531 with respect to the substrate SB based on the sensing signal and the image signal that are supplied from the displacement sensing part 540.

For example, the system controlling part 550 extracts a height of an upper surface of the substrate SB and a height of a lower surface of the mask 531 based the sensing signal supplied from the laser displacement sensor 541 and determines a gap between the substrate SB and the mask 531. When the gap is different from a reference value, the system controlling part 550 calculates a compensation value for the Z axis and applies the calculated compensation value to the mask transporting portion 532.

The system controlling part 550 extracts the location of the reference line RL of the mask 531 and the location of the signal line SL of the substrate SB based on the image signal supplied from the camera 542 and calculates a distance between the reference line RL and the signal line SL. When the calculated distance is different from a reference value, the system controlling part 550 calculates a compensation value for the Y axis and applies the calculated compensated value to the mask transporting portion 532.

The mask transporting portion 532 transports the mask 531 in the Z-axis direction based on the Z-axis compensation value, and transports the mask 531 in the Y-axis direction based on the Y-axis compensation value. The mask 531 is transported by a distance between the aligning pattern 531*b* and the exposure pattern 531*a* at a period corresponding to a transportation speed of the substrate SB.

Figure 5:
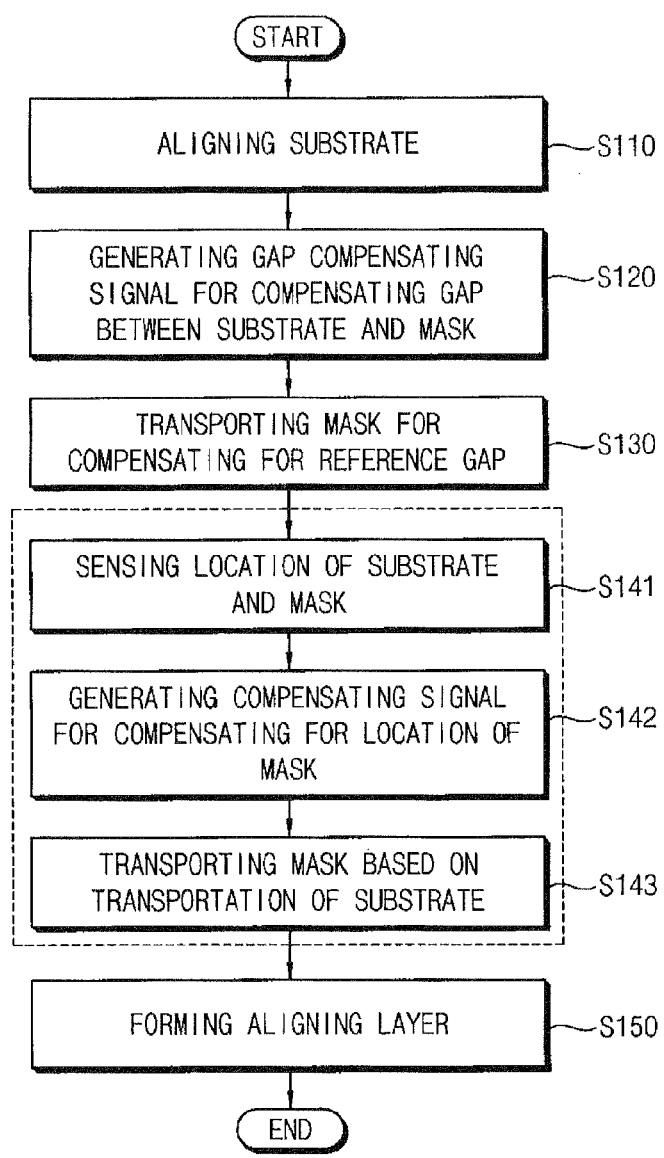
FIG. 5 is a flow chart illustrating a photo alignment method using the exposure system shown in FIG. 4.
Figure 6A:
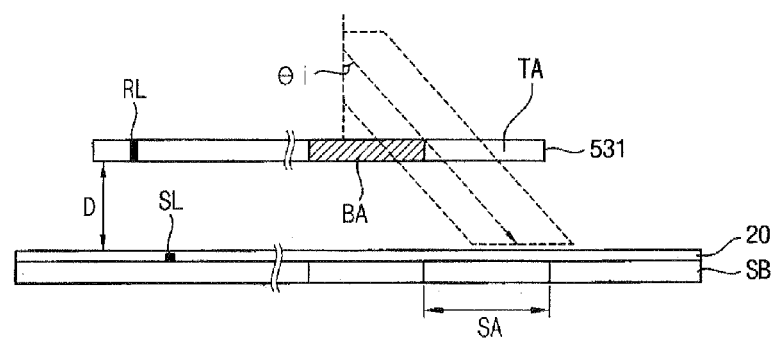
FIGS. 6A and 6B are cross-sectional views illustrating a method of compensating for a gap between a mask and the substrate shown in FIG. 5.
Figure 6B:
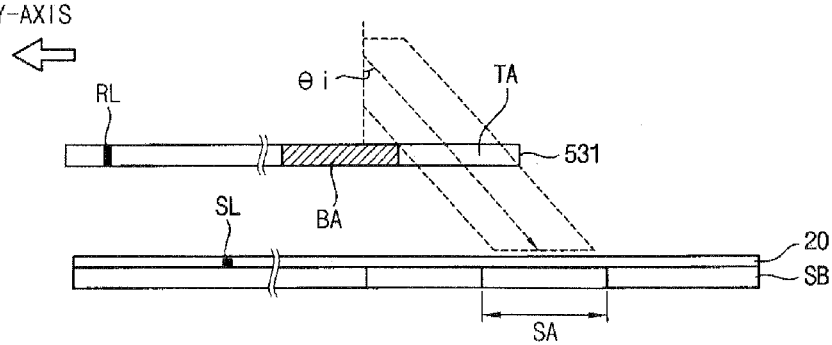
Figure 7A:
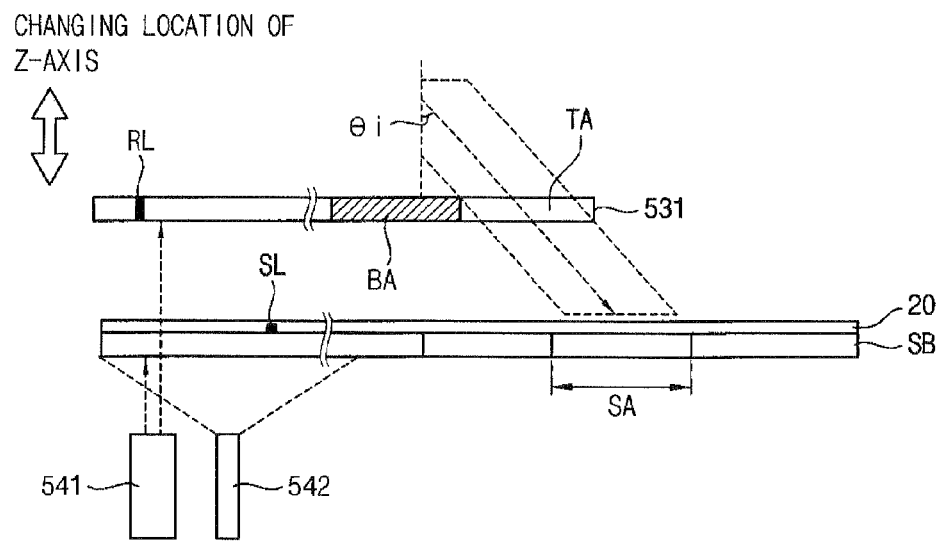
FIGS. 7A and 7B are respectively a cross-sectional view and a plan view illustrating compensating for a gap with respect to a location of the substrate shown in FIG. 5.
Figure 7B:
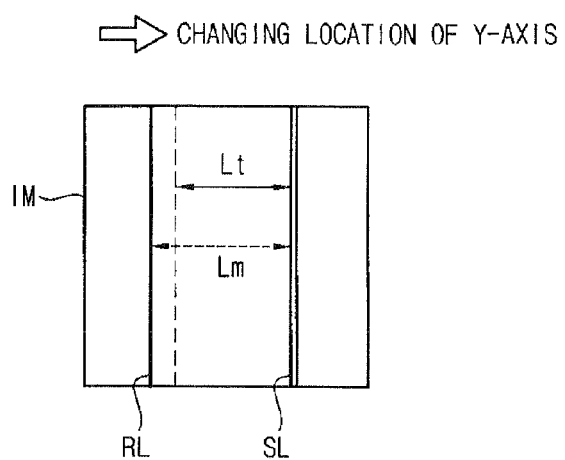

FIG. 5 is a flow chart illustrating a method of photo alignment using the exposure system shown in FIG. 4. FIGS. 6A and 6B are cross-sectional views illustrating a method of compensating for a gap between a mask and the substrate shown in FIG. 5. FIGS. 7A and 7B, respectively, are a cross-sectional view and a plan view illustrating compensating for a gap with respect to a location of the substrate shown in FIG. 5.

Referring to FIGS. 4, 5 and 6A, a polymer layer 20 is formed on a base substrate. The polymer layer 20 includes a high polymer layer. In FIGS. 4, 5 and 6A, the base substrate having the polymer layer 20 is the substrate SB. The substrate SB is disposed on the substrate transporting part 510 of the exposure system (step S110).

For example, light generated from the light source part 520 is irradiated onto the mask 531 in the X-axis direction. The substrate SB is transported in the Y-axis direction that is substantially perpendicular to the X-axis direction. The light forms an inclined incident angle θi with respect to a normal line of the mask 531. The light incident toward the mask 531 at the inclined incident angle θi passes through the transmission portion TA onto a region different from the sub regions SA of the substrate SB. The sub regions SA of the substrate SB correspond to a region for photo alignment. An offset value is determined based on the inclined incident angle θi and the gap D between the mask 531 and the substrate SB so that the light having passed through the transmission portion TA is irradiated onto an exact location of the sub regions SA.

The system controlling part 550 determines the offset value based on the gap D and the inclined incident angle θi. Equation 1 represents a relationship between the offset value Offset, the gap D and the inclined incident angle θi:

$$\text{Offset} = D \cdot \tan \theta i \qquad \text{[Equation 1]}$$

The system controlling part 550 generates a reference gap compensating signal based on the offset value and compensates for the reference gap between the substrate SB and the mask 531 (step S120).

The mask transporting portion 532 transports the mask 531 based on the reference gap compensating signal in the Y-axis direction (step S130). Thus, the exposure process is performed while the reference cell gap is maintained between the mask 531 and the substrate SB.

The displacement sensing part 540 senses locations of the substrate SB and the mask 531 every predetermined period (step S141). For example, the predetermined period corresponds to the movement of the substrate SB by about 3 um. For example, the displacement sensing part 540 senses the location of the substrate SB whenever the substrate SB moves by about 3 um.

The system controlling part 550 generates a displacement compensation signal based on the sensed signal supplied from the displacement sensing part 540 (step S142). The system controlling part 550 compensates for the location of the mask 531 with reference to the movement of the substrate SB using the displacement compensation signal.

The mask transporting part 532 transports the mask 531 based on the displacement compensation signal supplied from the system controlling part 550 (step S143).

The steps S141, S142 and S142 are performed in real time during the exposure process.

For example, as shown in FIGS. 7A and 7B, the laser displacement sensor 541 irradiates laser beams to the mask 531 and the substrate SB, and determines locations of the mask 531 and the substrate SB based on laser beams that are reflected from the mask 531 and the substrate SB (step S141).

The camera 542 picks up an image of the reference line RL of the mask 531 and the signal line SL of the substrate SB (step S141).

The laser displacement sensor 541 and the camera 542 transport the sensed signal and the image signal to the system controlling part 550.

The system controlling part 550 extracts a height of the upper surface of the substrate SB based on the sensed signal that is supplied in real time. The system controlling part 550 also extracts a height of the lower surface of the mask 531. The system controlling part 550 extracts a gap between the substrate SB and the mask 531 based on the extracted heights. When the extracted gap is different from a reference value, the system controlling part 550 generates a Z-axis compensation signal and applies the Z-axis compensation signal to the mask transporting portion 532. However, when the extracted gap is the same or substantially the same as the reference value, the system controlling part 550 does not generate the Z-axis compensation signal, and the mask 531 maintains a location of the Z-axis.

The system controlling part 550 extracts a location of the reference line RL of the mask 531 and a location of the signal line SL of the substrate SB based on the image signal that is supplied in real time. The system controlling part 550 extracts a separation distance Lm between the reference line RL and the signal line SL. When the separation distance Lm is different from a reference value Lt, the system controlling part 550 generates a Y-axis compensation signal (step S142) and applies the Y-axis compensation signal to the mask transporting portion 532. However, when the separation distance Lm is the same or substantially the same as the reference value Lt, the system controlling part 550 does not generate the Y-axis compensation signal, and that the mask 531 maintains a location of the Y-axis.

The mask transporting portion 532 transports the mask 531 based on the Z-axis compensation signal and the Y-axis compensation signal that are provided from the system controlling part 550 (step S143). A location of the mask 531 is changed in real time based on the movement of the substrate SB.

A period of the transportation of the mask 531 corresponds to a distance between the exposure pattern 531a and the aligning pattern 531b. The displacement sensing part 540 and the system controlling part 550 sense a change of the location of the substrate SB while the substrate SB moves between the aligning pattern 531b and the exposure pattern 531a, and generate a compensation signal for changing the location of the mask 531 based on the change of the location of the substrate SB.

When light is irradiated to the polymer layer 20 of the substrate SB, the polymer chains are formed in the sub regions SA. The polymer chains have an alignment direction that is inclined toward the incident direction of the light. Thus, the polymer layer 20 is changed into an alignment layer having the polymer chains (step S150).

Figure 8A:
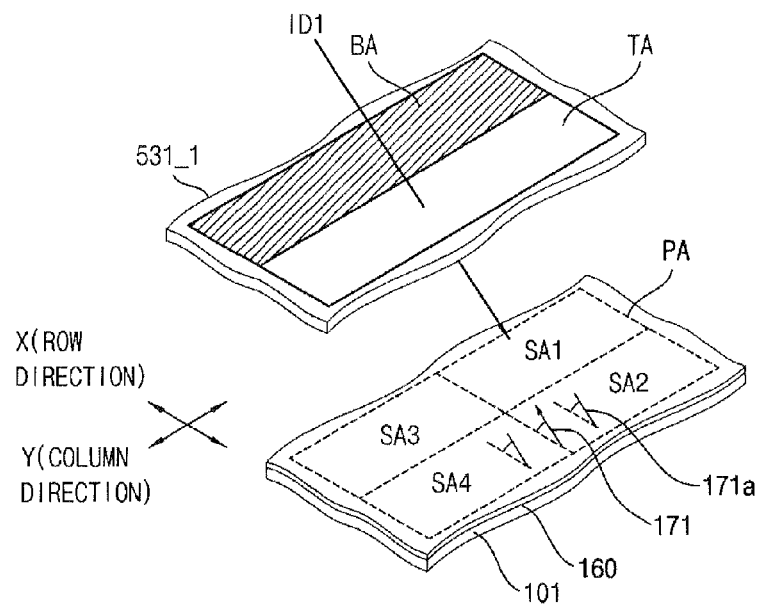
FIGS. 8A and 8B are perspective views illustrating forming the first alignment layer shown in FIG. 2.
Figure 8B:
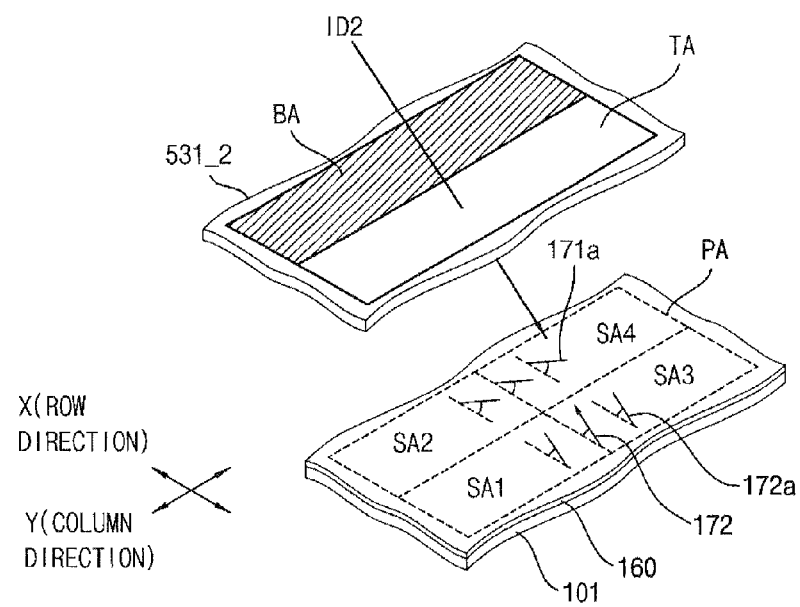

FIGS. 8A and 8B are perspective views illustrating forming the first alignment layer shown in FIG. 2.

Referring to FIGS. 2 and 8A, an array layer AL is formed on the first base substrate 101. The array layer AL includes the gate line GL, the data line DL and the switching element TR. A pixel electrode PE is formed on the first base substrate 101 having the array layer AL. The pixel electrode PE is electrically connected to the switching element TR through a contact hole of an insulating layer. The insulating layer is formed between the switching element TR and the pixel electrode PE. The insulating layer includes an organic insulating layer, an inorganic insulating layer, etc.

A first polymer layer 160 is formed on the first base substrate 101 having the pixel electrode PE. The first polymer layer 160 includes a high polymer. The first base substrate 101 having the first polymer layer 160 is exposed by the exposure system shown in FIG. 4 to form the first alignment layer 170 having the polymer chins in the alignment direction.

For example, the light blocking portion BA of a first mask 531_1 corresponds to first and third sub regions SA1 and SA3 of a first column, and the transmission portion TA of the first mask 531_1 corresponds to second and fourth sub regions SA2 and SA4 of a second column adjacent to the first column.

According to an embodiment, an incident direction (e.g., X-axis direction) of light from the exposure system is substantially perpendicular to an extended direction (e.g., Y-axis direction) of an interface between the transmission portion TA and the light blocking portion BA. Thus, light having passed through the transmission portion TA is incident into the second and fourth sub regions SA2 and SA4 of the first base substrate 101.

Light is incident into the first polymer layer 160 in a first incident direction ID1 so that the first polymer layer 160 in the second and fourth sub regions SA2 and SA4 is photopolymerized. Thus, first polymer chains 171a that are inclined toward the first incident direction ID1 with respect to a normal direction of a top surface of the first polymer layer 160 are formed. The first polymer chains 171a having the first alignment direction 171 are formed in the second and fourth sub regions SA2 and SA4.

Referring to FIG. 8B, the first base substrate 101 having the first polymer chains is rotated by about 180 degrees.

The light blocking portion BA of a second mask 531_2 corresponds to the second and fourth sub regions SA2 and SA4 of the second column. The transmission portion TA of the second mask 531_2 corresponds to the first and third sub regions SA1 and SA3 of the first column.

According to an embodiment, an irradiation direction (e.g. X-direction) of light is substantially perpendicular to the extended direction (e.g., Y-direction) of the interface between the transmission portion TA and the light blocking portion BA. Thus, light having passed through the transmission portion TA is incident into the first and third sub regions SA1 and SA3 of the first base substrate 101.

Light is incident into the first and third sub regions SA1 and SA3 of the first polymer layer 160 in a second incident direction ID2, so that the first polymer layer 160 in the first and third sub regions SA1 and SA3 is photopolymerized. Thus, second polymer chains 172a that are inclined toward the second incident direction ID2 with respect to a normal direction of the top surface of the first polymer layer 160 are formed. The second polymer chains 172a having the second alignment direction 172 are formed in the first and third sub regions SA1 and SA3. The second alignment direction 172 is opposite to the first alignment direction 171.

Figure 9A:
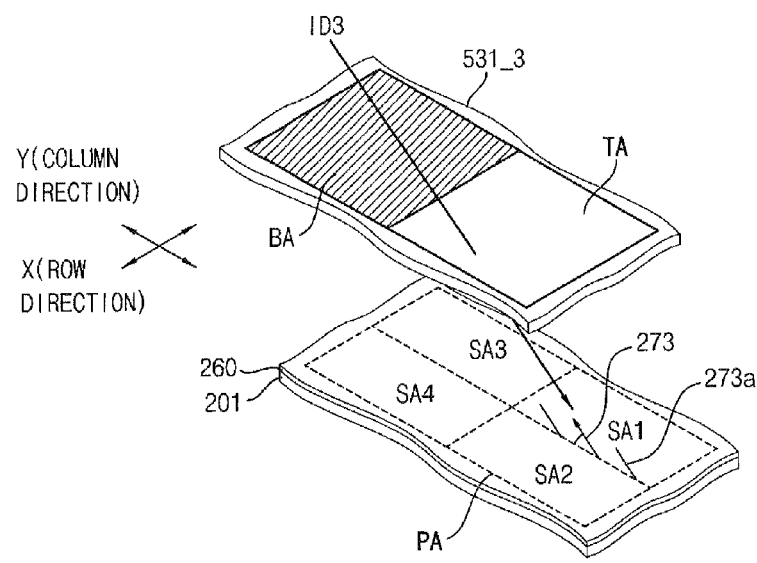
FIGS. 9A and 9B are perspective views illustrating forming the second alignment layer shown in FIG. 2.
Figure 9B:
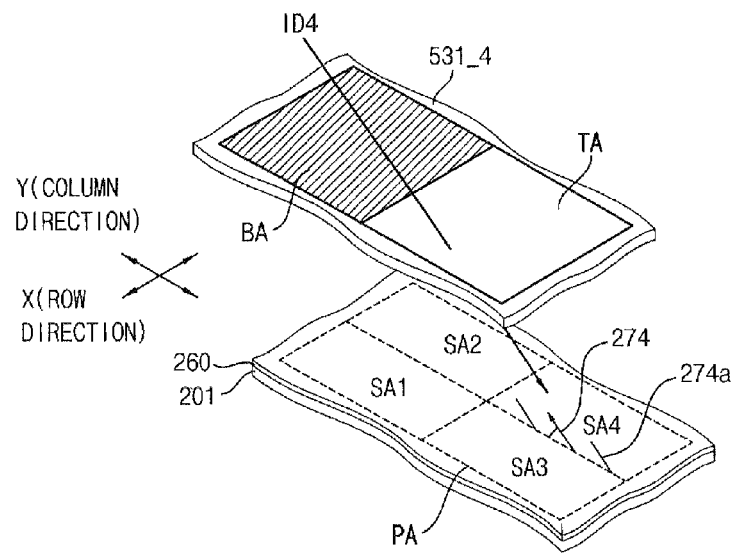

FIGS. 9A and 9B are perspective views illustrating forming the second alignment layer shown in FIG. 2.

Referring to FIGS. 2 and 9A, the light blocking pattern BP, the color filter CF, the overcoating layer OC and the second electrode layer CE are formed on the second base substrate 201.

A second polymer layer 260 is formed on the second base substrate 201 having the second electrode layer CE. The second polymer layer 260 includes a high polymer. The second base substrate 201 having the second polymer layer 260 is exposed by the exposure system of FIG. 4 to form the second alignment layer 270 having polymer chains in an inclined direction.

For example, the light blocking portion BA of a third mask 531_3 corresponds to the third and fourth sub regions SA3 and SA4 of a second row, and the transmission portion TA of the third mask 531_3 corresponds to the first and second sub regions SA1 and SA2 of a first row adjacent to the second row.

According to an embodiment, an irradiation direction (e.g., X-direction) of light from the exposure system is substantially perpendicular to an extended direction (e.g., Y-direction) from an interface between the transmission portion TA and the light blocking portion BA. Thus, light having passed through the transmission portion TA is incident into the first and second sub regions SA1 and SA2 of the second base substrate 201.

Light is incident into the first and second sub regions SA1 and SA2 of the second polymer layer 260 in a third incident direction ID3 so that the second polymer layer in the first and second sub regions SA1 and SA2 is photopolymerized to form third polymer chains 173a. The third polymer chains 173a are inclined toward the third incident direction ID3 with respect to a normal direction of a top surface of the second polymer layer 260. The third polymer chains 273a aligned in a third alignment direction 273 are formed in the first and second sub regions SA1 and SA2 of the second base substrate 102.

Referring to FIG. 9B, the second base substrate 201 having the third polymer chains 173a is rotated by about 180 degrees.

The light blocking portion BA of a fourth mask 531_4 corresponds to the first and second sub regions SA1 and SA2 of the first row. The transmission portion TA of the fourth mask 531_4 corresponds to the third and fourth sub regions SA3 and SA4 of the second row.

According to an embodiment, an irradiation direction (e.g., X-direction) of light is substantially perpendicular to the extended direction (e.g., Y-direction) of the interface between the transmission portion TA and the light blocking portion BA. Thus, light having passed through the transmission portion TA is incident into the third and fourth sub regions SA3 and SA4 of the first base substrate 101.

Light is incident into the third and fourth sub regions SA3 and SA4 of the second polymer layer 260 in a fourth incident direction ID4, so that the second polymer layer 260 in the third and fourth sub regions SA3 and SA4 is photopolymerized. Thus, fourth polymer chains 274a that are inclined toward the fourth incident direction ID4 with respect to the normal direction of the top surface of the second polymer layer 260 are formed. The fourth polymer chains 274a having the fourth alignment direction 274 are formed in the third and fourth sub regions SA3 and SA4. The fourth alignment direction 274 is opposite to the third alignment direction 273.

Alternatively, the liquid crystal display panel includes a first alignment layer having polymer chains of third and fourth alignment directions shown in FIGS. 9A and 9B and a second alignment layer having polymer chains of first and second alignment directions shown in FIGS. 8A and 8B.

For example, according to an embodiment, the first alignment layer 170 has polymer chains in the first and second sub regions SA1 and SA2 of the first row as shown in FIG. 9A or polymer chains in the third and fourth sub regions SA3 and SA4 of the second row as shown in FIG. 9B. The polymer chains in the first and second sub regions SA1 and SA2 are inclined in the third alignment direction 273 shown in FIG. 9A, and the polymer chains in the third and fourth sub regions SA3 and SA4 are inclined in the fourth alignment direction 274 shown in FIG. 9B. According to an embodiment, the second alignment layer 270 has polymer chains in the second and fourth sub regions SA2 and SA4 of the second column as shown in FIG. 8A, and polymer chains in the first and third sub regions SA1 and SA3 of the first column as shown in FIG. 8B. The polymer chains in the second and fourth sub regions SA2 and SA4 are inclined in the first alignment direction 171 shown in FIG. 8A, and the polymer chains in the first and third sub regions SA1 and SA3 are inclined in the second alignment direction 172 shown in FIG. 8B.

Figure 10A:
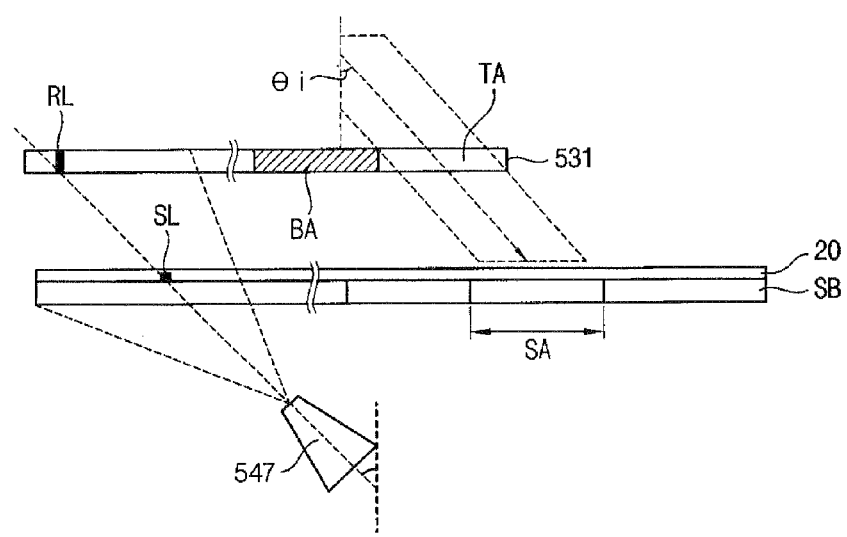
FIGS. 10A and 10B are respectively a cross-sectional view and a plan view illustrating an exposure system in accordance with an exemplary embodiment of the present invention.
Figure 10B:
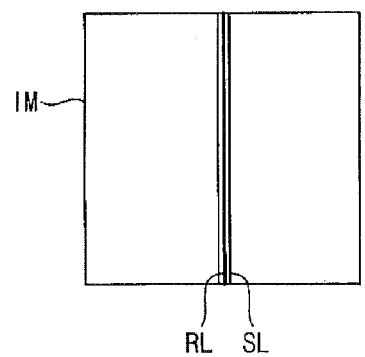

FIGS. 10A and 10B, respectively, are a cross-sectional view and a plan view illustrating an exposure system in accordance with an exemplary embodiment of the present invention. The exposure system shown in FIGS. 10A and 10B is the same or substantially the same as the exposure system described in connection with FIG. 4 except for a displacement sensing part.

Referring to FIGS. 10A and 10B, the displacement sensing part 540 includes an oblique camera 547.

The oblique camera 547 is inclined in an incident direction of light and takes an image of a mask 531 and a substrate SB. Light is incident into a polymer layer in the incident direction.

An image signal IM generated by the oblique camera 547 includes an image of a reference line RL of an aligning pattern 531b of the mask 531 and a signal line SL (or an aligning line) of the substrate SB.

When the image of the substrate SB and the mask 531 is taken by the oblique camera 547, the reference line RL is on a same line as the signal line SL as shown in FIG. 10B.

Thus, the system controlling part 550 compares locations of the reference line RL and the signal line SL in the image signal supplied from the oblique camera 547 and controls a movement of the mask 531.

For example, when the reference line RL of the image signal is on the same line as the signal line SL of the image signal, the mask 531 is at a correct position, and the mask 531 is not transported. However, when the reference line RL of the image signal is not on the same line as the signal line SL of the image signal, the mask 531 is at an incorrect position, and the mask 531 is transported by a distance between the reference line RL and the signal line SL along a Y-axis direction.

Figure 11A:
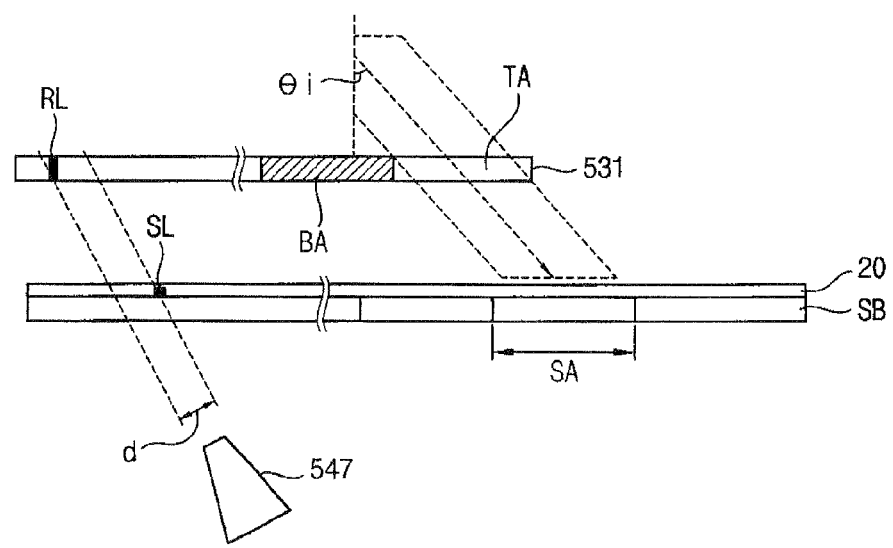
FIGS. 11A and 11B are respectively a cross-sectional view and a plan view illustrating a method of compensating for a location using the exposure system shown in FIGS. 10A and 10B.
Figure 11B:
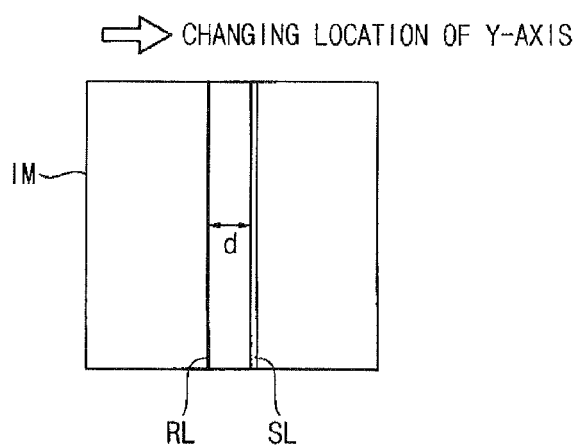

FIGS. 11A and 11B, respectively, are a cross-sectional view and a plan view illustrating a method of compensating for a location using the exposure system shown in FIGS. 10A and 10B.

A method of forming an alignment layer using an exposure system according to the present embodiment is the same or substantially the same as of the method described in connection with FIGS. 5, 6A and 6B except for compensating for a location of a mask.

Referring to FIGS. 11A and 11B, a substrate SB having a base substrate and a polymer layer formed on the base substrate is arranged on a substrate transporting part 510 (step S110).

Light is incident into a mask 531 and forms an incident angle $\theta i$ with a normal line of the mask 531. An offset value is determined based on the incident angle $\theta i$ and a gap D between the mask 531 and the substrate SB. Equation 1 represents a relationship between the offset value, the incident angle $\theta i$ and the gap D.

The system controlling part 550 generates a gap compensating signal based on the offset value and compensates for the gap between the substrate SB and the mask 531 (step S120).

The mask transporting part 532 transports the mask 531 in a Y-axis direction based on the reference gap compensation signal (step S130). Thus, the gap between the mask 531 and the substrate SB is adjusted, and an exposure process is performed.

For example, referring to FIG. 11A, the oblique camera 547 takes an image of the substrate SB and the mask 531 every predetermined period and senses locations of the mask 531 and the substrate SB (step S141). For example, the predetermined period corresponds to the movement of the substrate SB by about 3 um. For example, the displacement sensing part 540 senses the location of the substrate SB whenever the substrate SB moves by about 3 um.

The system controlling part 550 extracts a location of the reference line RL of the mask 531 and a location of the signal line SL of the substrate SB based on an image signal supplied from the oblique camera 547. When the extracted reference line RL is at a same position as the signal line SL, the mask 531 is not transported.

However, referring to FIG. 11B, when the extracted reference line RL is at a different position from the signal line SL, the system controlling part 550 extracts a separation distance L between the extracted reference line RL and the signal line SL. The system controlling part 550 generates a Y-axis compensation signal corresponding to the extracted separation distance L (step S142).

The mask transporting part 532 transports the mask 531 based on the displacement compensation signal supplied from the system controlling part 550 (step S143).

The steps of S141, S142 and S142 are performed in real time during the exposure process.

Thus, the mask 531 is transported in real time in response to a change of the location of the substrate SB. The period of transporting the mask 531 corresponds to a distance between the exposure pattern 531a and the aligning pattern 531b of the mask 531.

When light is irradiated onto the polymer layer 20 of the substrate SB, the polymer chains are formed in the sub regions SA. The polymer chains have an alignment direction that is inclined toward the incident direction of the light. Thus, the polymer layer 20 is changed into an alignment layer having the polymer chains (step S150).

Figure 12:
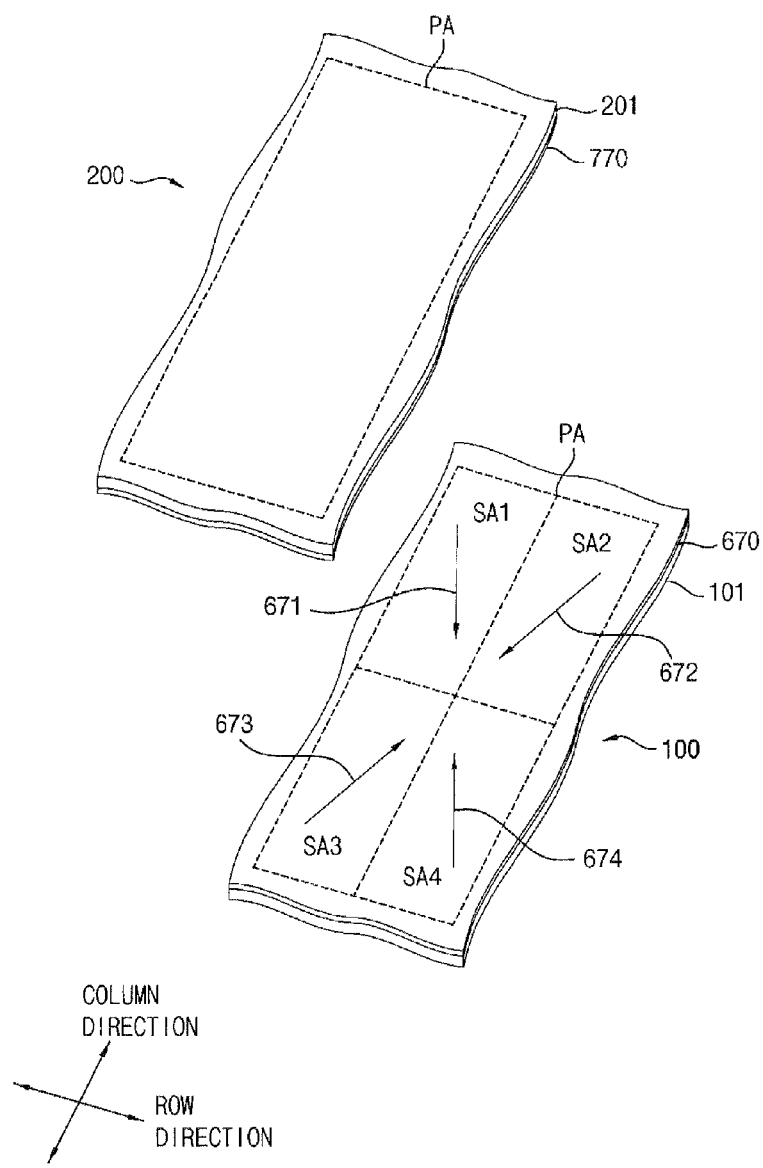
FIG. 12 is a plan view illustrating a display panel in accordance with an embodiment of the present invention.

FIG. 12 is a plan view illustrating a display panel in accordance with an embodiment of the present invention.

A display panel according to the present exemplary embodiment is the same or substantially the same as of the display panel described in connection with FIG. 2 except for first and second alignment layers.

Referring to FIGS. 2 and 12, the first display substrate 100 includes a first alignment layer 670, and the second display substrate 200 includes a second alignment layer 770.

The first alignment layer 670 is disposed on the first base substrate 101 having a pixel electrode PE. The pixel electrode PE is formed in a pixel region PA of the first base substrate 101. The pixel region PA has a plurality of sub regions SA1, SA2, SA3 and SA4. The sub regions SA1, SA2, SA3 and SA4 are arranged in a 2×2 matrix pattern. A first row of the 2×2 matrix pattern includes first and second sub regions SA1 and SA2. A second row of the 2×2 matrix pattern includes third and fourth sub regions SA3 and SA4. A first column of the 2×2 matrix pattern includes the first and third sub regions SA1 and SA3. A second column of the 2×2 matrix pattern includes the second and fourth sub regions SA2 and SA4.

The first alignment layer 670 includes first, second, third and fourth alignment directions 671, 672, 673 and 674 in the first, second, third and fourth sub regions SA1, SA2, SA3 and SA4, respectively. The first, second, third and fourth alignment directions 671, 672, 673 and 674 concentrate on a center of the 2×2 matrix pattern and form a concentration structure.

The second display substrate 200 includes the second alignment layer 770. The second alignment layer 770 has a vertical alignment mode in the first, second, third and fourth sub regions SA1, SA2, SA3 and SA4.

In an exemplary embodiment, the display panel includes the first and second alignment layers 670 and 770 and have first, second, third and fourth aligning directions in the first, second, third and fourth sub regions SA1, SA2, SA3 and SA4, respectively. The first, second, third and fourth aligning directions have the same or substantially the same concentration structure as the first, second, third and fourth alignment directions 671, 672, 673 and 674.

Figure 13:
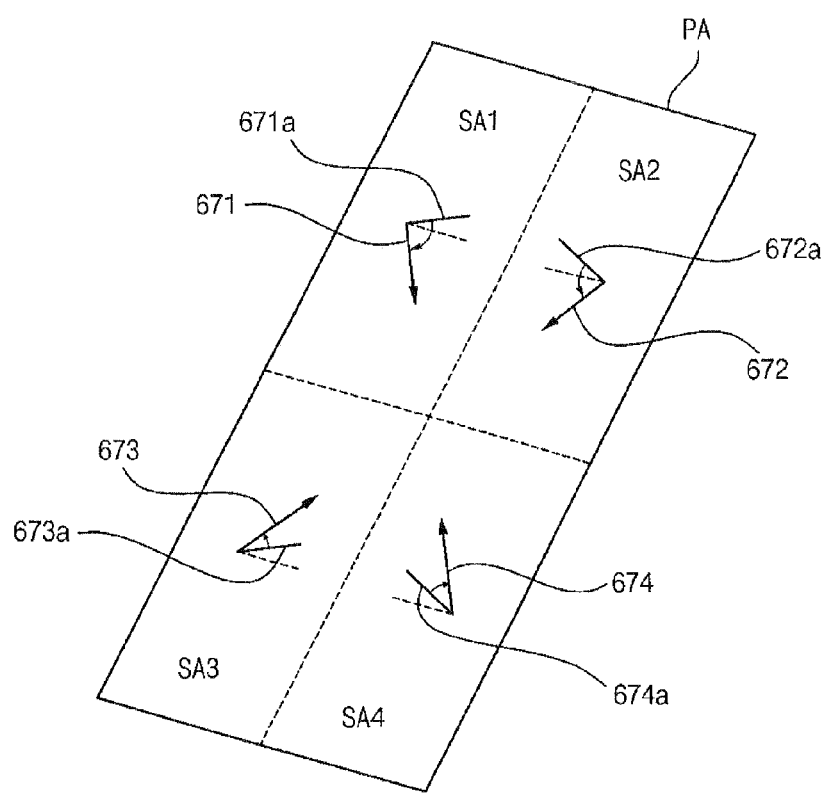
FIG. 13 is a perspective view illustrating forming a first alignment layer as shown in FIG. 12.

FIG. 13 is a perspective view illustrating forming a first alignment layer shown in FIG. 12.

Hereinafter, forming the first alignment layer 670 is described with reference to FIGS. 8A, 8B, 9A, 9B and 13. The first alignment layer 670 includes a high polymer layer that is photopolymerized.

Referring to FIGS. 8A and 13, the second and fourth sub regions SA2 and SA4 of the polymer layer on the substrate is photo aligned by a first mask 531_1 through a first photo aligning process.

The light blocking portion BA of the first mask 531_1 corresponds to the first and third sub regions SA1 and SA3 of the pixel region PA, and the transmission portion TA of the first mask 531_1 corresponds to second and fourth sub regions SA2 and SA4 of the pixel region PA.

Light is incident into the second and fourth sub regions SA2 and SA4 of the polymer layer in the first incident direction ID1 so that the polymer layer in the second and fourth sub regions SA2 and SA4 is photopolymerized. Thus, second and fourth polymer chains 672a and 674a that are inclined toward the first incident direction ID1 with respect to a normal direction of a top surface of the polymer layer are formed.

Referring to FIGS. 8B and 13, the first and third sub regions SA1 and SA3 of the polymer layer on the substrate is photo aligned by a second mask 531_2 through a first photo aligning process.

The light blocking portion BA of the second mask 531_2 corresponds to the second and fourth sub regions SA2 and SA4 of the pixel region PA, and the transmission portion TA of the second mask 531_2 corresponds to the first and third sub regions SA1 and SA3 of the pixel region PA.

Light is incident into the first and third sub regions SA1 and SA3 of the polymer layer in the second incident direction ID2 so that the polymer layer adjacent in the first and third sub regions SA1 and SA3 is photopolymerized. Thus, first and third polymer chains 671a and 673a that are inclined toward the second incident direction ID2 with respect to the normal direction of the top surface of the polymer layer are formed.

Referring to FIGS. 9A and 13, the first and second regions SA1 and SA2 of the polymer layer on the substrate is photo aligned by a third mask 531_3 through a second photo aligning process. The second photo aligning process is performed in a smaller exposure amount than an exposure amount of the first photo aligning process. For example, according to an embodiment, the exposure amount of the second photo aligning process is one third of the exposure amount of the first photo aligning process. Alternatively, the second photo aligning process is performed in a greater exposure amount than an exposure amount of the first photo aligning process.

The light blocking portion BA of the third mask 531_3 corresponds to the third and fourth sub regions SA3 and SA4 of the pixel region PA, and the transmission portion TA of the third mask 531_3 corresponds to the first and second sub regions SA1 and SA2 of the pixel region PA.

Light is incident into the first and second sub regions SA1 and SA2 of the polymer layer in the third incident direction ID3. When light is incident into the first region SA1 in the third incident direction ID3, the first polymer chains 671a in the first sub region SA1 rotate toward the third incident direction ID3 so that the first polymer chains 671a are aligned in a first alignment direction 671. The first alignment direction is toward a center of the 2×2 matrix pattern with respect to a normal line of the top surface of the polymer layer. Thus, the first polymer chains 671a in the first sub region SA1 are aligned in the first alignment direction 671.

When light is incident into the second sub region SA2 in the third incident direction ID3, the second polymer chains 672a in the second sub region SA2 rotate toward the third incident direction ID3 so that the second polymer chains 672a are aligned in a second alignment direction 672. The second alignment direction is toward the center of the 2×2 matrix pattern with respect to the normal line of the top surface of the polymer layer. Thus, the second polymer chains 672a in the second sub region SA2 are aligned in the second alignment direction 672.

Referring to FIGS. 9B and 13, the third and fourth regions SA3 and SA4 of the polymer layer on the substrate is photo aligned by a fourth mask 531_4 through the second photo aligning process. The second photo aligning process is performed in a smaller exposure amount than an exposure amount of the first photo aligning process. For example, according to an embodiment, the exposure amount of the second photo aligning process is one third of the exposure amount of the first photo aligning process. Alternatively, the second photo aligning process is performed in a greater exposure amount than an exposure amount of the first photo aligning process.

The light blocking portion BA of the fourth mask 531_4 corresponds to the first and second sub regions SA1 and SA2 of the pixel region PA, and the transmission portion TA of the fourth mask 531_4 corresponds to the third and fourth sub regions SA3 and SA4 of the pixel region PA.

Light is incident into the third and fourth sub regions SA3 and SA4 of the polymer layer in the fourth incident direction ID4. When light is incident into the third region SA3 in the fourth incident direction ID4, the third polymer chains 673a in the third sub region SA3 rotate toward the fourth incident direction ID4 so that the third polymer chains 673a are aligned in a third alignment direction 673. The third alignment direction 673 is toward the center of the 2×2 matrix pattern with respect to the normal line of the top surface of the polymer layer. Thus, the third polymer chains 673a in the third sub region SA3 are aligned in the third alignment direction 673.

When light is incident into the fourth sub region SA4 in the fourth incident direction ID4, the fourth polymer chains 674a in the fourth sub region SA4 rotate toward the fourth incident direction ID4 so that the fourth polymer chains 674a are aligned in a fourth alignment direction 674. The fourth alignment direction 674 is toward the center of the 2×2 matrix pattern with respect to the normal line of the top surface of the polymer layer. Thus, the fourth polymer chains 674a in the fourth sub region SA4 are aligned in the fourth alignment direction 674.

According to an embodiment, in the display panel, the aligning directors of the liquid crystal molecules between the first and second alignment layers 670 and 770 are aligned to have the first, second, third and fourth aligning directions A1, A2, A3 and A4 shown in FIG. 1, and a concentration structure is thus formed. The first alignment layer 670 has the first, second, third and fourth alignment directions 671, 672, 673 and 674, and the second alignment layer 770 has a vertical alignment mode.

Alternatively, the second alignment layer has the first, second, third, and fourth alignment directions, and the first alignment layer has the vertical alignment mode.

Therefore, the response speed of the liquid crystal molecules, together with light transmittance of the display panel can increase, and linear after images can decrease.

Figure 14:
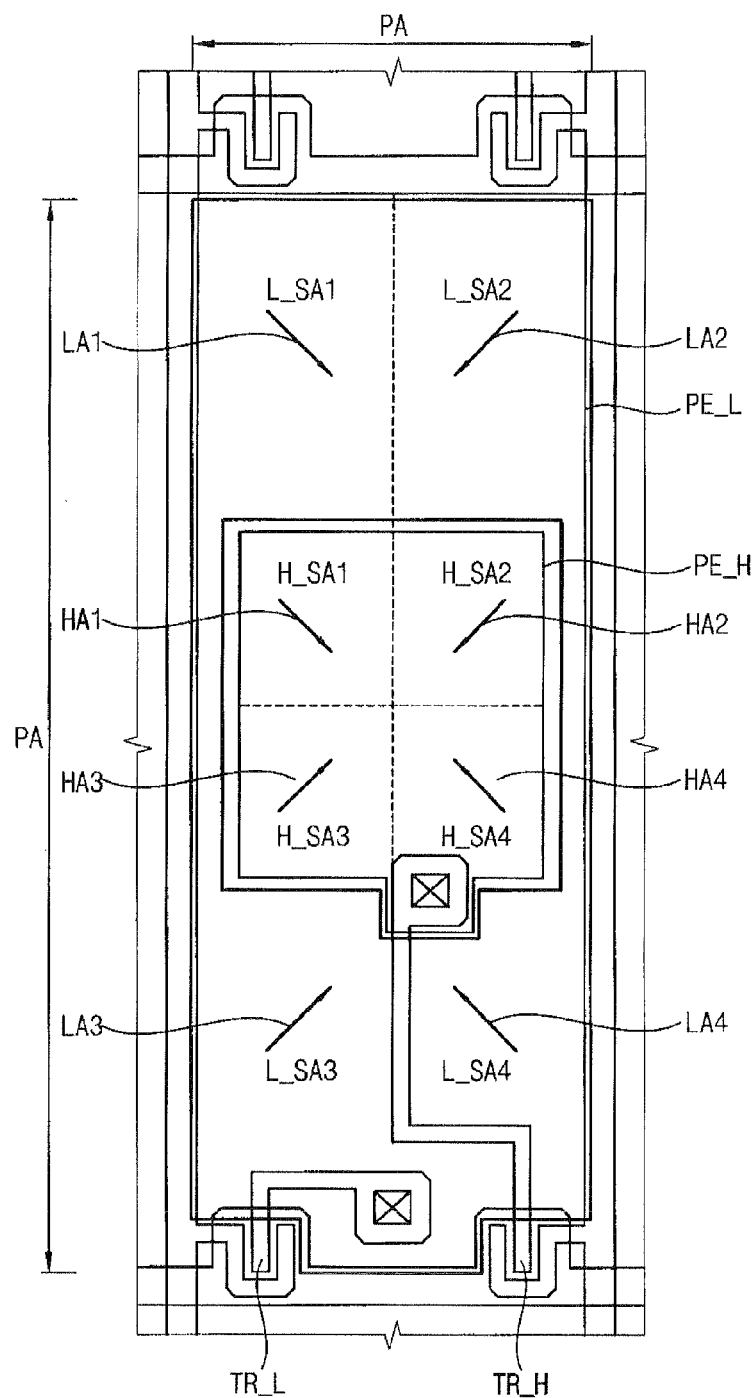
FIG. 14 is a plan view illustrating a display panel in accordance with an exemplary embodiment of the present invention.

FIG. 14 is a plan view illustrating a display panel in accordance with an exemplary embodiment of the present invention.

Referring to FIG. 14, the display panel includes a pixel region PA having a high pixel region and a low pixel region.

A high pixel electrode PE_H is disposed in the high pixel region. A pixel voltage having a high level is applied to the high pixel electrode PE_H through a high switching element TR_H. The high pixel region includes a plurality of sub regions. For example, the high pixel region includes first, second, third and fourth high sub regions H_SA1, H_SA2, H_SA3 and H_SA4 arranged in a 2×2 matrix pattern. A first row of the 2×2 matrix pattern has the first and second high sub regions H_SA1 and H_SA2. A second row of the 2×2 matrix pattern has the third and fourth high sub regions H_SA3 and H_SA4. A first column of the 2×2 matrix pattern has the first and third high sub regions H_SA1 and H_SA3. A second column of the 2×2 matrix pattern has the second and fourth high sub regions H_SA2 and H_SA4.

The first, second, third and fourth high sub regions H_SA1, H_SA2, H_SA3 and H_SA4 have first, second, third and fourth high aligning directions HA1, HA2, HA3 and HA4, respectively, and form a concentration structure.

A low pixel electrode PE_L is disposed in the low pixel region. A pixel voltage having a low level is applied to the low pixel electrode PE_L through a low switching element TR_L. The low pixel region includes a plurality of sub regions. For example, the low pixel region includes first, second, third and fourth low sub regions L_SA1, L_SA2, L_SA3 and L_SA4 arranged in a 2×2 matrix pattern. A first row of the 2×2 matrix pattern has the first and second low sub regions L_SA1 and L_SA2. A second row of the 2×2 matrix pattern has the third and fourth low sub regions L_SA3 and L_SA4. A first column of the 2×2 matrix pattern has the first and third low sub regions L_SA1 and L_SA3. A second column of the 2×2 matrix pattern has the second and fourth low sub regions L_SA2 and L_SA4.

The first, second, third and fourth low sub regions L_SA1, L_SA2, L_SA3 and L_SA4 have first, second, third and fourth low aligning directions LA1, LA2, LA3 and LA4, respectively, and form the concentration structure.

The display panel described in connection with FIG. 14 has the same or substantially the same concentration structure as the concentration structure formed by the method described in connection with FIGS. 1 to 13.

Figure 15A:
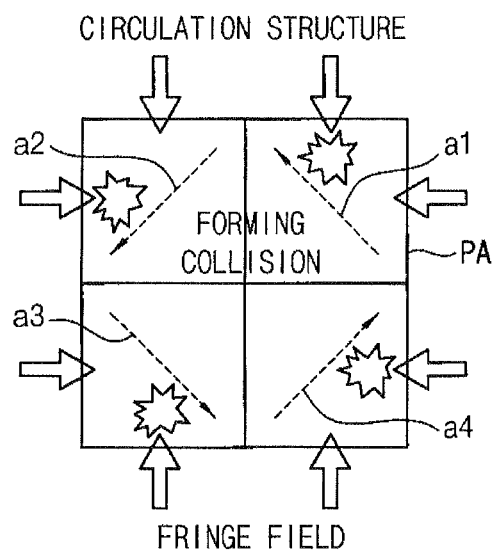
FIGS. 15A and 15B are plan views illustrating response characteristics of liquid crystals of display panels in accordance with exemplary embodiments of the present invention.
Figure 15B:
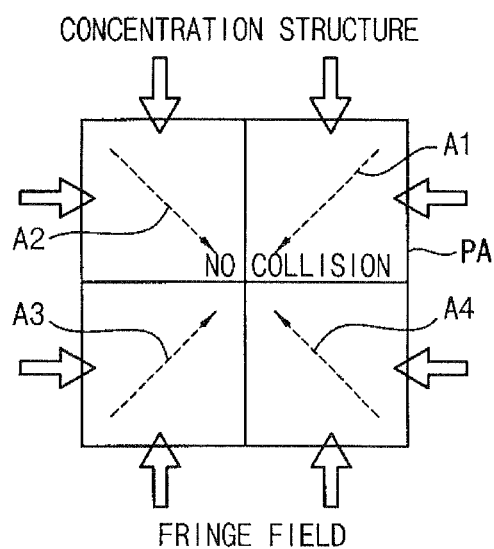
Figure 15C:
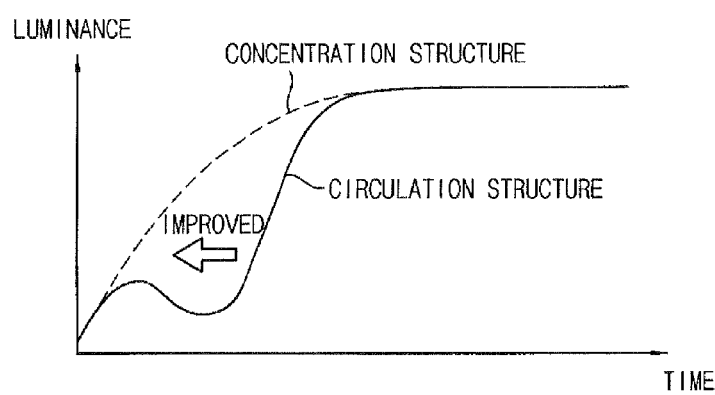
FIG. 15C is a graph illustrating a relationship between luminance and time of the response characteristics of the liquid crystals of the display panels shown in FIGS. 15A and 15B.

FIGS. 15A and 15B are plan views illustrating response characteristics of liquid crystal molecules of a display panel in accordance with an exemplary embodiment of the present invention. FIG. 15C is a graph illustrating a relationship between luminance and time of the response characteristics shown in FIGS. 15A and 15B.

FIG. 15A is a plan view illustrating response characteristics of liquid crystal molecules of a display panel having aligning directions a1, a2, a3 and a4 in a circulation structure in accordance with an embodiment of the present invention. FIG. 15B is a plan view illustrating response characteristics of liquid crystal molecules of a display panel having aligning directions A1, A2, A3 and A4 in a concentration structure in accordance with an exemplary embodiment of the present invention.

Referring to FIGS. 15A and 15B, a fringe field is formed on a peripheral region of a pixel region.

In the case that the display panel has the aligning directions a1, a2, a3 and a4 in the circulation structure, the liquid crystal molecules collide with one another when arranged by the fringe field. Thus, the arrangement of the liquid crystal molecules is distorted. When the arrangement of the liquid crystals is distorted by the fringe field, rearrangement of the liquid crystals may take long time. A response of the display panel having the circulation structure is delayed. The delay of the response speed deteriorates image display quality of high speed display devices, such as a three-dimensional display device.

However, in the case that the display panel has the aligning directions A1, A2, A3 and A4 in the concentration structure, the liquid crystal molecules are aligned toward the center of the pixel region so that the liquid crystal molecules do not collide with one another when arranged by the fringe field. The center is opposite to the peripheral region of the pixel region. Thus, the arrangement of the liquid crystal molecules are not distorted. Rearrangement of the liquid crystal molecules does not take long time. Response speed of the display panel having the concentration structure is increased. The image display quality of the high speed display devices, such as the three-dimensional display device, can be improved.

Figure 16A:
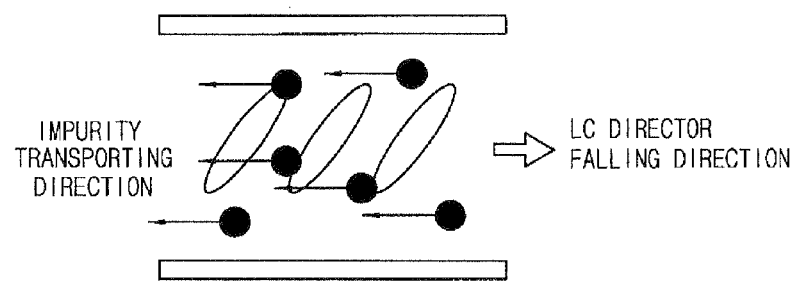
FIGS. 16A, 16B, and 16C are respectively a cross-sectional view and plan views illustrating a movement direction of impurities in display panels in accordance with exemplary embodiments of the present invention.
Figure 16B:
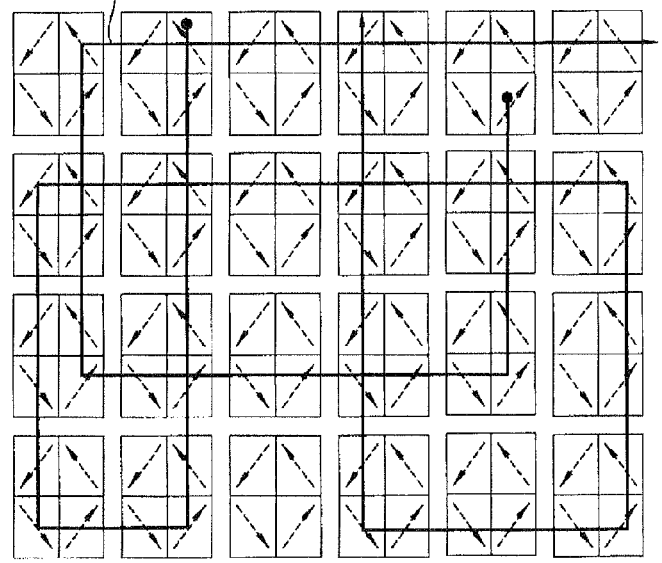
Figure 16C:
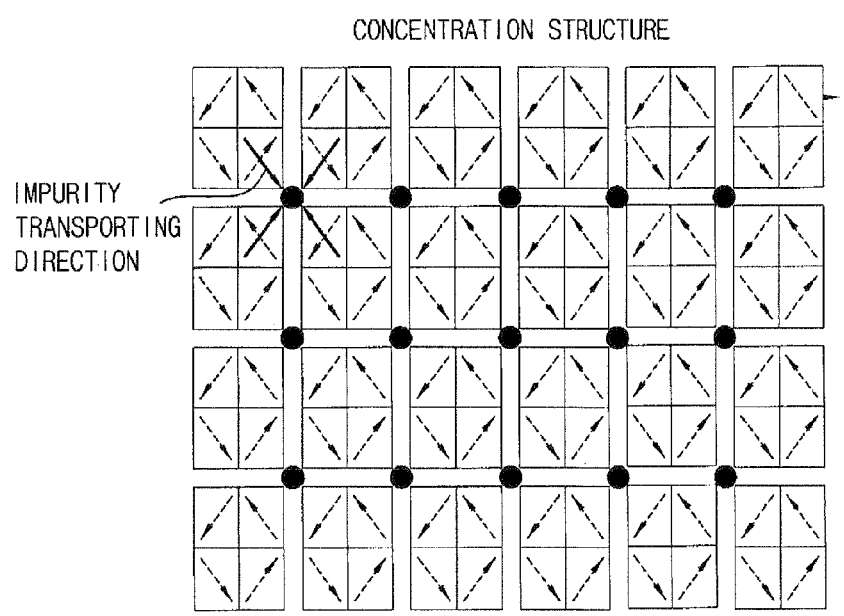

FIGS. 16A, and 16B and 16C, respectively, are a cross-sectional view, and plan views illustrating a movement direction of impurities in a display panel in accordance with an exemplary embodiment of the present invention.

FIG. 16A illustrates the movement direction of the impurities according to an inclination direction of aligning directors. FIG. 16B illustrates a display panel of the circulation structure. FIG. 16C illustrates a display panel of the concentration structure.

Referring to FIG. 16A, the impurities moves in a direction opposite to the inclination direction of the aligning directors. The impurities are stacked at a boundary between a black image and a white image. A voltage difference increases at the boundary between the black and white images. The impurities may form an afterimage at the boundary between the black and white images.

Referring to FIG. 16B, the aligning directors of the display panel having the circulation structure are aligned along a peripheral region of the pixel region in a circulation direction. Thus, impurities may move along the peripheral region in a direction opposite to the circulation direction. The impurities may freely move between adjacent pixel regions, and are thus stacked at the boundary between the white and black images so that an afterimage may be displayed.

However, referring to FIG. 16C, the aligning directors of the display panel having the concentration structure are aligned toward the center of the pixel region. Thus, impurities may move toward the peripheral region and form a plurality of spots, so that the movement of the impurities may be restricted. Thus, the impurities are not stacked at the boundary between the white and black images, thus preventing the afterimage from occurring.

Figure 17A:
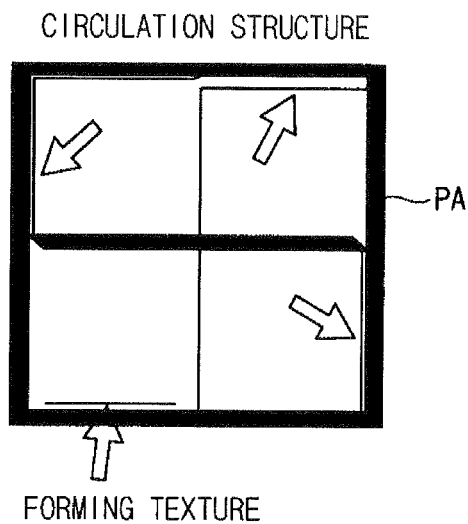
FIGS. 17A and 17B are plan views illustrating transmittances of display panels in accordance with exemplary embodiments of the present invention.
Figure 17B:
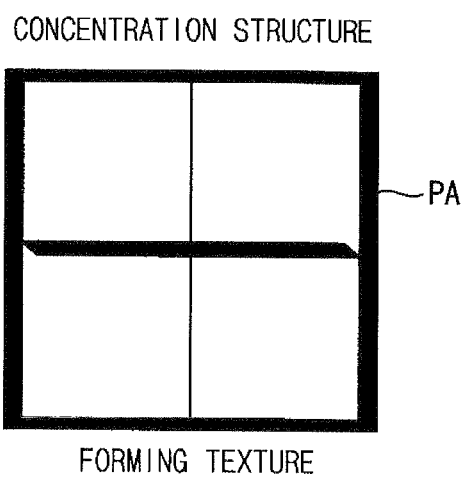

FIGS. 17A and 17B are plan views illustrating transmittances of display panels in accordance with exemplary embodiments of the present invention.

Referring to FIGS. 17A and 17B, a fringe field is formed in a peripheral region of a pixel region.

In the circulation structure, liquid crystal molecules collide with one another by the fringe field so that the arrangement of the liquid crystal molecules in the peripheral region may be distorted. Thus, a texture image of a black band shape may be formed in the peripheral region. The texture image decreases light transmittance of the display panel.

However, in the concentration structure, the liquid crystals do not collide with one another by the fringe field. Thus, the occurrence of the texture image can be prevented.

According to a simulation result, a light transmittance of the circulation structure was about 0.24711, and a light transmittance of the concentration structure was about 0.24856. A light transmittance of a display device having the concentration structure is greater than a light transmittance of a display device having the circulation structure by about 6%.

According to the embodiments of the present invention, the response speed and light transmittance of the liquid crystal molecules are increased, and linear afterimages are prevented from occurring.

The foregoing is illustrative of the embodiments of the present invention and is not to be construed as limiting thereof. Although a few exemplary embodiments of the present invention have been described, those skilled in the art will readily appreciate that many modifications are possible in the exemplary embodiments. Accordingly, all such modifications are intended to be included within the scope of the embodiments of the present invention as defined in the claims.

What is claimed is:

1. A photo alignment method comprising:
   aligning a substrate and a mask so that the substrate is spaced apart from the mask by a predetermined gap, wherein an organic layer is formed on the substrate, the mask having a transmission portion and a light blocking portion;
   irradiating light through the mask in a direction substantially parallel with an interface between the transmission portion and the light blocking portion of the mask;
   forming polymer chains on an upper portion of the organic layer, wherein the polymer chains are aligned in an alignment direction toward an incident direction of the light;
   sensing locations of the substrate and the mask in real time; and
   transporting the mask to a predetermined location with respect to the substrate based on the sensed locations of the substrate and the mask.

2. The photo alignment method of claim 1, further comprising:
   determining an offset value between the substrate and the mask based on the gap between the substrate and the mask; and
   transporting the mask in response to the offset value.

3. The photo alignment method of claim 1, wherein a direction of transporting the mask is substantially parallel with the interface between the transmission portion and the light blocking portion of the mask.

4. The photo alignment method of claim 1, further comprising:
   sensing a height between an upper surface of the substrate and a lower surface of the mask; and
   taking an image of a reference line on the mask and an alignment line on the substrate in a direction substantially perpendicular to a transportation direction of the substrate.

5. The photo alignment method of claim 4, further comprising:
   transporting the mask based on the sensed height so that the gap between the mask and the substrate is substantially the same as the predetermined gap; and
   transporting the mask so that the reference line in the taken image is spaced apart from the alignment line by a predetermined reference value.

6. The photo alignment method of claim 1, further comprising:
   taking an image of a reference line on the mask and an alignment line on the substrate in a direction substantially parallel with a direction of irradiating the light.

7. The photo alignment method of claim 6, further comprising:
   transporting the mask so that the reference line in the taken image is on a same line as the alignment line.

8. The photo alignment method of claim 1, wherein the mask further comprises:
   an alignment pattern having a reference line for aligning the mask with respect to the substrate;
   the transmission portion spaced apart from the alignment pattern in a direction of transporting the substrate; and
   an exposure pattern including the light blocking portion, and wherein the mask is transported at a period corresponding to a distance between the alignment pattern and the exposure pattern.

9. The photo alignment method of claim 1, wherein the substrate further comprises a pixel region having a plurality of sub regions arranged in a matrix pattern,
   and wherein the photo alignment method further comprises:
   irradiating the light to sub regions of a first column through a first mask in a direction substantially parallel with a row direction toward the first column to form first polymer chains inclined in a first alignment direction; and
   irradiating the light to sub regions of a second column through a second mask in a direction substantially parallel with the row direction toward the second column to form second polymer chains inclined in a second alignment direction.

10. The photo alignment method of claim 9, further comprising:
    irradiating the light in a first sub region and a second sub region in a direction substantially parallel with a column direction toward the first column so that the first polymer chains and the second polymer chains are rotated toward a center of the matrix pattern, the first polymer chains of a first row being formed in the first sub region, the second polymer chains of the first row being formed in the second sub region; and irradiating the light in a third sub region and a fourth sub region in a direction substantially parallel with the column direction toward the second column so that the first polymer chains and the second polymer chains are rotated toward a center of the matrix pattern, the first polymer chains of a second row being formed in the third sub region, the second polymer chains of the second row being formed in the fourth sub region.

11. The photo alignment method of claim 1, wherein the substrate further comprises a pixel region having a plurality of sub regions arranged in a matrix pattern, and wherein the photo alignment method comprises:

forming first polymer chains arranged in a first alignment direction substantially parallel with a column direction in the sub regions in a first row toward the first column using a first mask; and forming second polymer chains arranged in a second alignment direction substantially parallel with the column direction in the sub regions in a second row toward the second column using a second mask.

* * * * *